United States Patent [19]

Matsuoka

[11] Patent Number: 5,494,169

[45] Date of Patent: Feb. 27, 1996

[54] IC CARRIER

[75] Inventor: Noriyuki Matsuoka, Yokohama, Japan

[73] Assignee: Yamaichi Electronics Co., Ltd., Tokyo, Japan

[21] Appl. No.: 352,168

[22] Filed: Dec. 1, 1994

Related U.S. Application Data

[63] Continuation of Ser. No. 266,640, Jun. 28, 1994, abandoned.

[30] Foreign Application Priority Data

Jun. 29, 1993 [JP] Japan .................................. 5-185460

[51] Int. Cl.$^6$ .................................................. B65D 85/30
[52] U.S. Cl. ......................... 206/722; 206/480; 206/724
[58] Field of Search ............................. 206/722, 724, 206/701, 706, 477, 480, 486

[56]  References Cited

U.S. PATENT DOCUMENTS

| | | |
|---|---|---|
| 3,409,861 | 11/1968 | Barnes et al. . |
| 3,892,312 | 7/1975 | Tems ........................ 206/328 |
| 4,598,308 | 7/1986 | James et al. . |
| 4,692,790 | 9/1987 | Oyamada . |
| 4,718,548 | 1/1988 | Estrada et al. ............. 206/329 |
| 4,747,483 | 5/1988 | Grabbe ...................... 206/334 X |
| 4,881,639 | 11/1989 | Matsuoka et al. ......... 206/328 |
| 4,886,169 | 12/1989 | Ayers et al. ............... 206/334 X |
| 4,918,513 | 4/1990 | Kurose et al. . |
| 4,933,747 | 6/1990 | Schroeder . |
| 5,066,245 | 11/1991 | Walker ...................... 206/328 X |
| 5,070,389 | 12/1991 | Noriyuki . |
| 5,076,794 | 12/1991 | Ganthier . |
| 5,133,256 | 7/1992 | Keaton ...................... 206/334 X |
| 5,139,437 | 8/1992 | Ikeya et al. . |
| 5,168,993 | 12/1992 | Yen .......................... 206/334 X |
| 5,220,196 | 6/1993 | Michii et al. . |
| 5,238,110 | 8/1993 | Ye ............................ 206/328 X |
| 5,289,032 | 2/1994 | Higgins, III et al. . |
| 5,296,741 | 3/1994 | Kim . |
| 5,309,326 | 5/1994 | Minoru . |
| 5,389,820 | 2/1995 | Matsuoka . |

FOREIGN PATENT DOCUMENTS

| | | |
|---|---|---|
| 1-272142 | 10/1989 | Japan . |
| 2-36556 | 2/1990 | Japan . |
| 3-29903 | 6/1991 | Japan . |

Primary Examiner—Jacob K. Ackun
Attorney, Agent, or Firm—Wenderoth, Lind & Ponack

[57] ABSTRACT

An IC carrier includes a movable corner ruler for restricting a first angular portion of an IC, and a reference corner ruler for restricting a second angular portion of the IC, the second angular portion of the IC being in a diagonal relation to the first angular portion of the IC. The movable corner ruler is resiliently supported by a spring structure such that the first angular portion is resiliently pushed toward the reference corner ruler. The movable ruler includes a pair of ruler elements for pushing those two sides of the IC which define the first angular portion of the IC, the movable corner ruler being movably resiliently supported by the spring structure for movement along such two sides of the IC.

8 Claims, 7 Drawing Sheets

IC CARRIER

This application is a Continuation of now abandoned application Ser. No. 08/266,640, filed on Jun. 28, 1994.

BACKGROUND OF THE INVENTION

1. Field of the Invention

This invention relates to an improvement of an IC carrier which retains an IC with a restricted angular portion for the purpose of enabling a correct positioning of the IC.

2. Prior Art

An IC carrier discussed in Japanese Utility Model Publication No. Hei 3-29903 comprises a pushing pin resiliently supported by a spring in such a manner as to direct the pin toward an angular portion of an IC. The angular portion of the IC is resiliently pushed by a distal end of the pushing pin so that another angular portion of the IC located on a diagonal line with respect to the first-mentioned angular portion is pushed against a reference corner ruler for a correct positioning. The pushing pin is allowed to move on a straight line which divides the angular portion of the IC into two equal parts and pushes the angular portion of the IC at one point on this straight line.

However, since the conventional IC carrier is of a construction in which the pushing pin is caused to push one point of the angular portion of the IC, it can be applied to an IC having a flat angular portion obtained by removing a sharp edge of the angular portion, but it is difficult to be applied to an IC having a comparatively sharp-edged angular portion because the IC cannot be pushed properly.

Moreover, a loading position of the IC relative to the IC carrier, a dimensional error of the IC, and the like tend to make it difficult to obtain a proper corresponding relation between the pushing pin and the IC angular portion, with the result that the pushing pin cannot properly push the angular portion of the IC and the IC is not correctly positioned by the pushing pin. It is difficult to apply the conventional IC carrier to a different type of IC (for example, a rectangular IC, etc.) in which an angular portion of the IC is away from a straight pushing line (straight line on which the pushing pin moves) of the pushing pin.

Moreover, it cannot be expected that, with the conventional IC carrier, an IC, which happens to be loaded in a position away from the straight line on which the pushing pin is to move, can be correctly repositioned.

OBJECT AND SUMMARY OF THE INVENTION

It is therefore an object of the present invention to provide an IC carrier which is provided with an improved means for correctly positioning and retaining an IC.

To achieve the above object, there is essentially provided an IC carrier comprising a movable corner ruler for restricting a first angular portion of an IC, and a reference corner ruler for restricting a second angular portion of the IC, the second angular portion of the IC being in a diagonal relation to the first angular portion of the IC. The movable corner ruler is resiliently supported by a spring structure such that the first angular portion is resiliently pushed toward the reference corner ruler. The movable ruler includes a pair of ruler elements for pushing those two sides of the IC which define the first angular portion of the IC, the movable corner ruler being movably resiliently supported for movement along such two sides of the IC.

The movable corner ruler and the reference corner ruler may be provided with claws for locking upper surfaces of the first and second angular portions of the IC.

Also, the pair of ruler elements of the movable corner ruler may be resiliently supported by a spring structure in the form of plate springs extending along the two sides of the IC which define the first angular portion of the IC.

Also, the pair of ruler elements of the movable corner ruler may be resiliently supported by a spring structure in the form of coil springs.

According to this invention, the movable corner ruler resiliently pushes two sides of the IC, which define an IC angular portion so as to push the other angular portion, which is located on the other end of a diagonal line of the IC with respect to the first-mentioned IC angular portion, with a pair of ruler elements against the reference corner ruler, and can be resiliently adjusted along the respective sides which define the IC angular portion during the course of pushing. Accordingly, even if the location of the IC angular portion is changed due to an incorrect IC loading position with respect to the IC carrier, dimensional error of the IC, etc., the IC can be pushed by the movable corner ruler while the IC angular portion is properly restricted by the pair of ruler elements. The IC can be correctly positioned and retained by the IC carrier while the incorrect loading position of the IC is corrected and the IC is pushed against the reference corner ruler.

The IC carrier of the present invention is not only applicable to an IC whose sharp-edged angular portion is removed, but also to an IC whose sharp-edged angular portion is not removed, in accordance with necessity.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE INVENTION

Embodiments of the present invention will now be described with reference to FIGS. 1 through 16.

Figure 13:
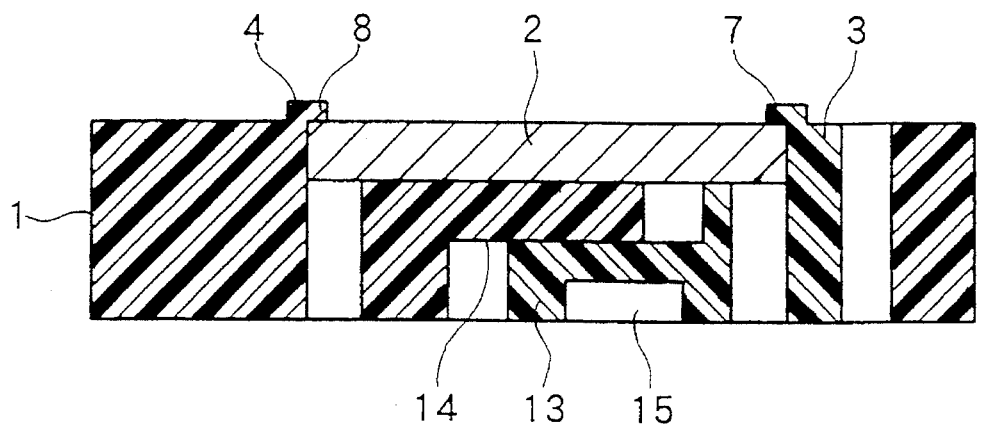
FIG. 13 is a cross-sectional view taken on line 13—13 of FIG. 12.
Figure 14:
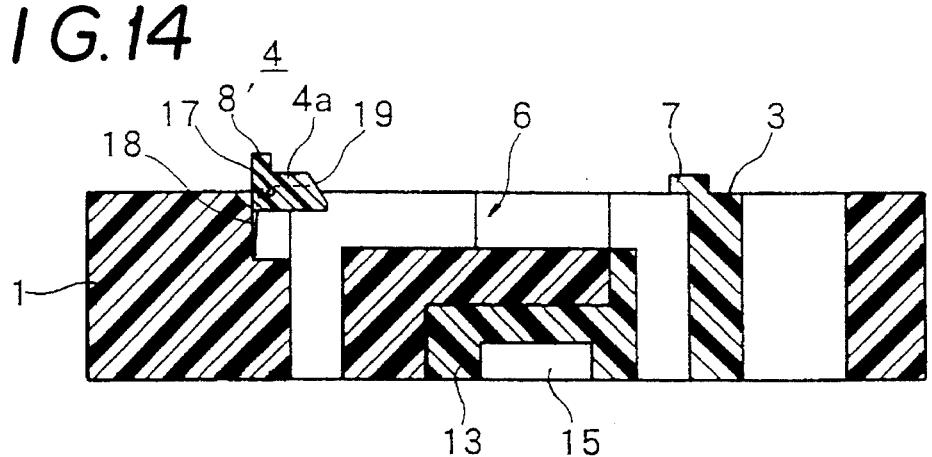
FIG. 14 is a cross-sectional view of an IC carrier, but showing another example of a reference corner ruler according to the present invention.
Figure 15:
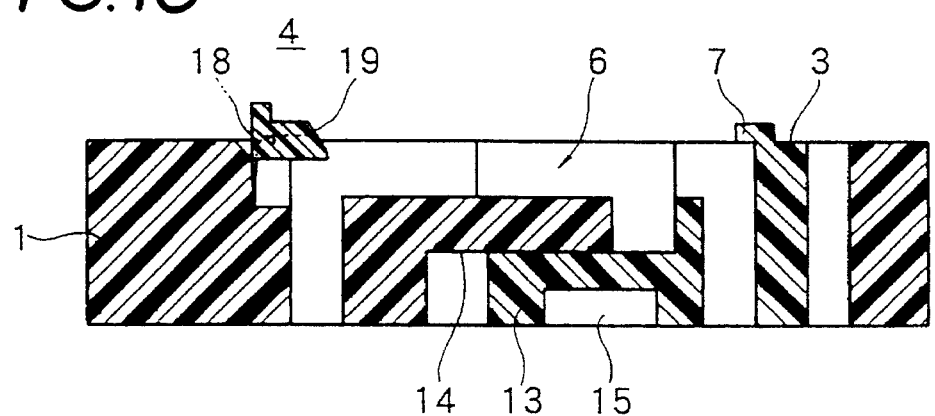
FIG. 15 is a cross-sectional view of the IC carrier of FIG. 14, but showing a state in which a movable corner ruler is moved to an IC restriction removed position.
Figure 16:
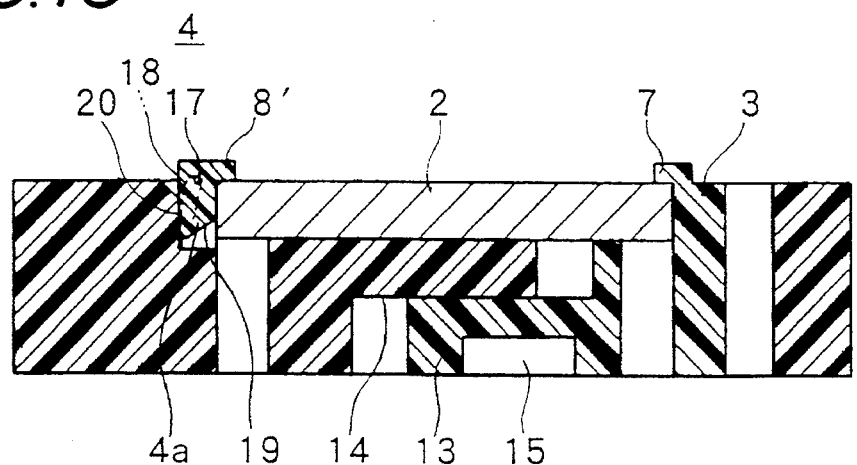
FIG. 16 is a cross-sectional view of the IC carrier of FIG. 14, but showing a state in which the movable corner ruler is moved to an IC retained position and the reference corner ruler is rotated sidewardly, thereby restricting and retaining the IC.

Reference numeral 1 denotes a carrier body having a generally square outer configuration, formed of an integrally molded insulative material. The carrier body 1 is provided with a movable corner ruler 3 for restricting an angular portion (first angular portion) of a generally square IC 2, which angular portion is located on one of diagonally opposite angles of the IC 2, and a reference corner ruler 4 for restricting the other angular portion (second angular portion) of the IC 2. FIGS. 1 to 13 show one embodiment in which the reference corner ruler 4 is fixed, and FIGS. 14 to 16 show another embodiment in which the reference corner ruler 4 is movable.

The movable corner ruler 3 includes a pair of ruler elements 5a and 5b for restricting two sides of the IC 2 which define the first angular portion. The pair of ruler elements 5a and 5b are so dimensioned that an inner angular space formed between the ruler elements 5 and 5b is well fitted to the first angular portion of the IC 2. The ruler elements 5a and 5b are provided at a connection area thereof with a locking claw 7. This locking claw 7 is engaged with an upper surface of a foremost end of the first angular portion of the IC 2. On the other hand, the reference corner ruler 4, which is so dimensioned as to be well fitted to the second angular portion of the IC 2, is provided with a lock claw 8 for engaging an upper surface of the second angular portion of the IC 2. The IC 2 is retained in an IC receiving portion 6 of the IC carrier body 1 with the pair of diagonally opposing angular portions of the IC 2 locked by the locking claws 7 and 8.

The movable corner ruler 3 is resiliently supported by a spring (or spring structure) 9 so that the first angular portion of the IC 2 is resiliently pushed toward the reference corner ruler 4. Also, the movable corner ruler 3 is movably resiliently supported for movement along the two sides of the IC 2 which defines the first angular portion of the IC 2.

Figure 1:
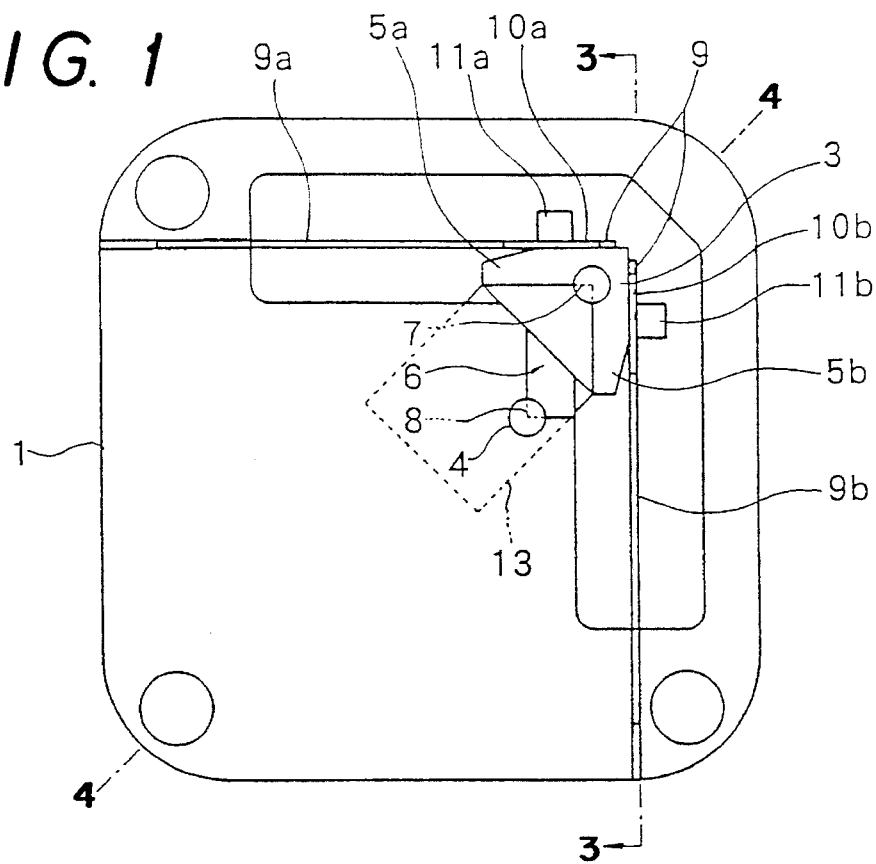
FIG. 1 is a plan view of an IC carrier according to one embodiment of the present invention.
Figure 7:
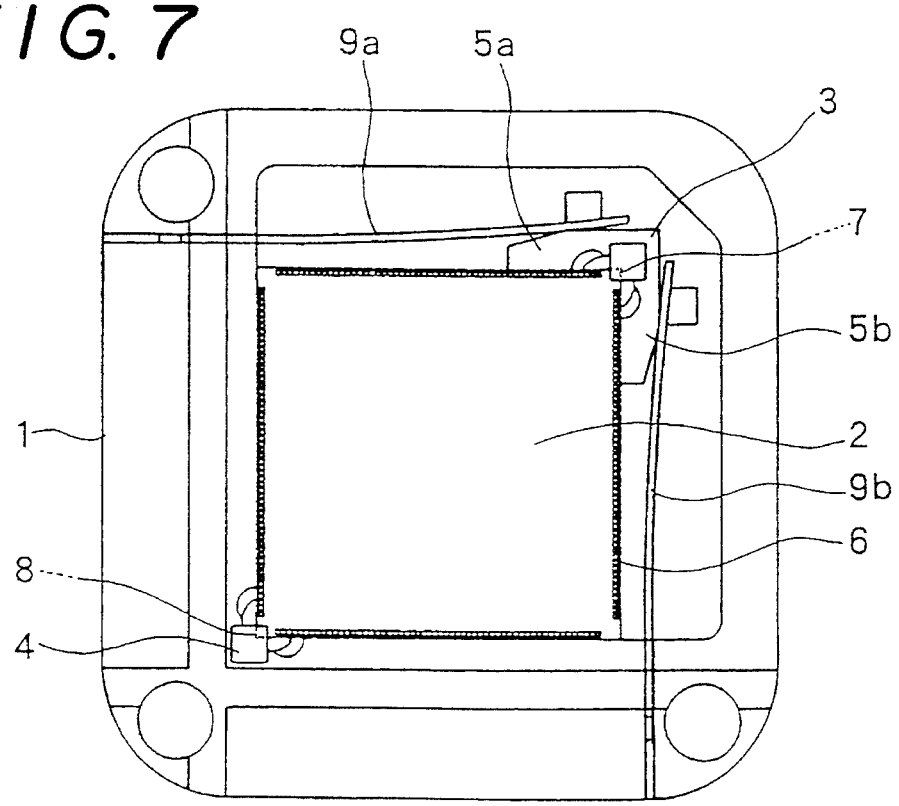
FIG. 7 is a plan view showing one mode of operation of the IC carrier of FIG. 1.
Figure 8:
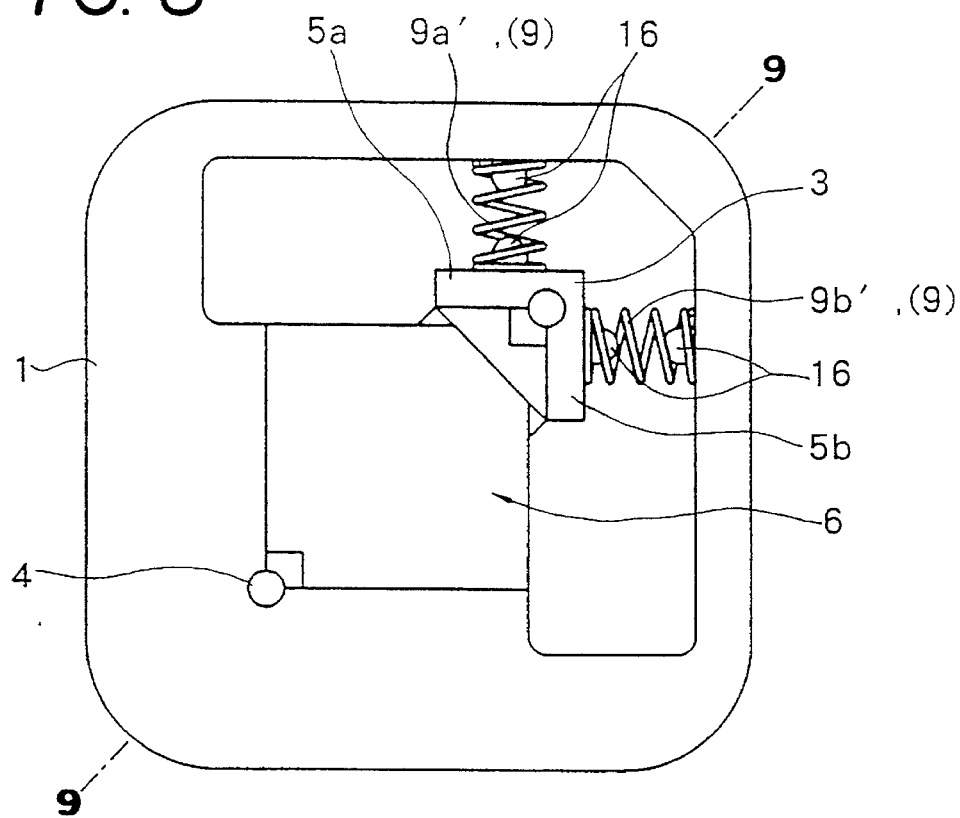
FIG. 8 is a plan view of an IC carrier, showing another example of a resilient support structure of a movable corner ruler according to the present invention.
Figure 9:
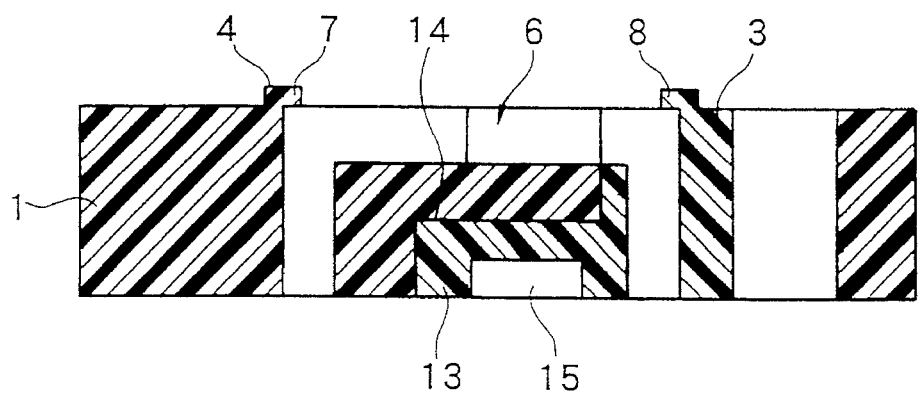
FIG. 9 is a cross-sectional view taken on line 9—9 of F. 8.

In one embodiment, as shown in FIGS. 1 and 7, as well as elsewhere, the IC 2 is resiliently supported by a spring structure in the form of plate springs 9a, 9b. Plate spring 9a extends along one of the two sides of the IC 2 which define the first angular portion of the IC 2. An elongated hole 10a is formed in one end of the plate spring 9a. A guide 11a projecting from an outer surface of the ruler element 5a is slide fitted in the elongated hole 10a so that the movable corner ruler 3 can move along one of the two sides which define the first angular portion of the IC 2. Likewise, plate spring 9b extends along the other side of the IC 2. An elongated hole 10b is formed in one end of the plate spring 9b. A guide 11b projecting from an outer surface of the ruler element 5b is slide fitted in the elongated hole 10b so that the movable corner ruler 3 can move along the other side of the IC 2. The plate springs 9a and 9b are provided at the other ends thereof with respective press-in claws 12. The press-in claws 12 are fixedly fitted in the carrier body 1.

Figure 2:
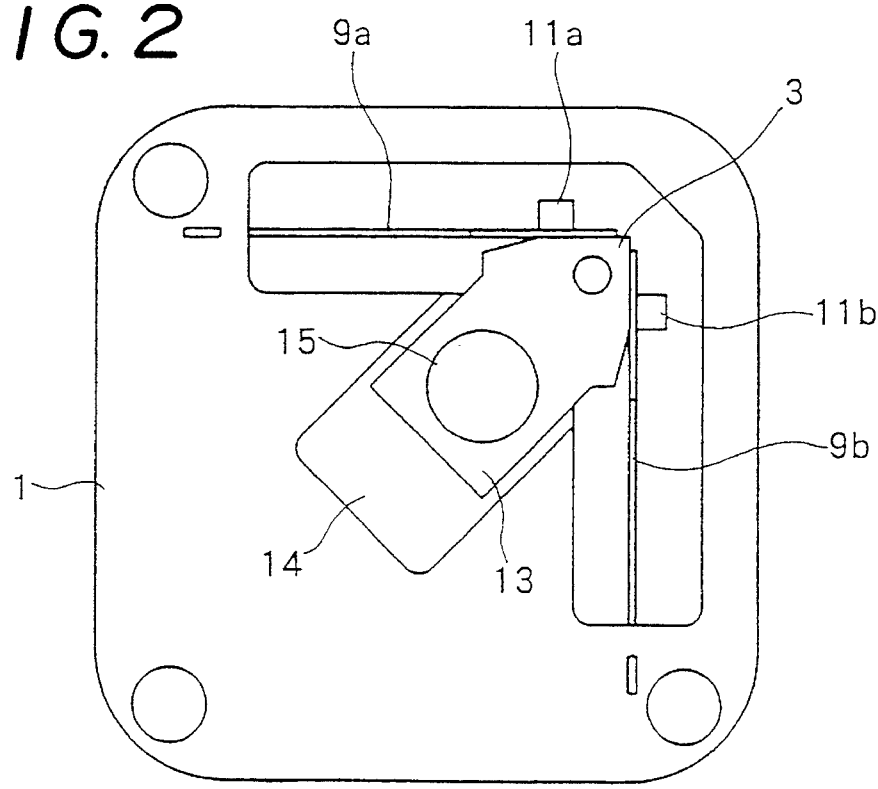
FIG. 2 is a bottom view of the IC carrier of FIG. 1.
Figure 3:
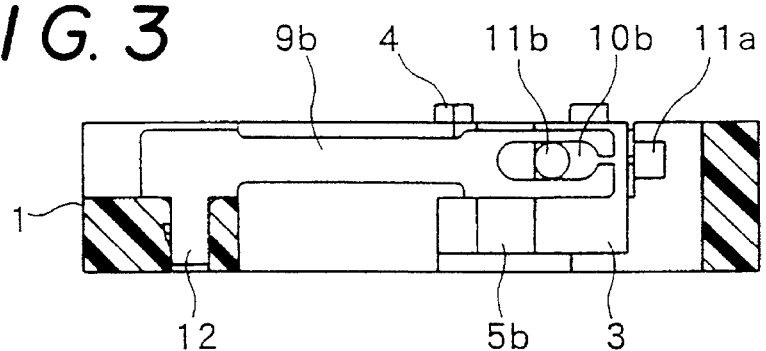
FIG. 3 is a cross-sectional view taken on line 3—3 of FIG. 1.
Figure 4:
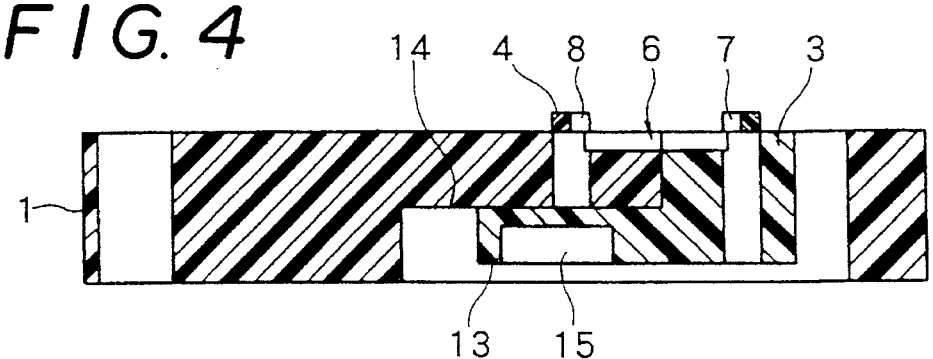
FIG. 4 is a cross-sectional view taken on line 4—4 of FIG. 1.
Figure 5:
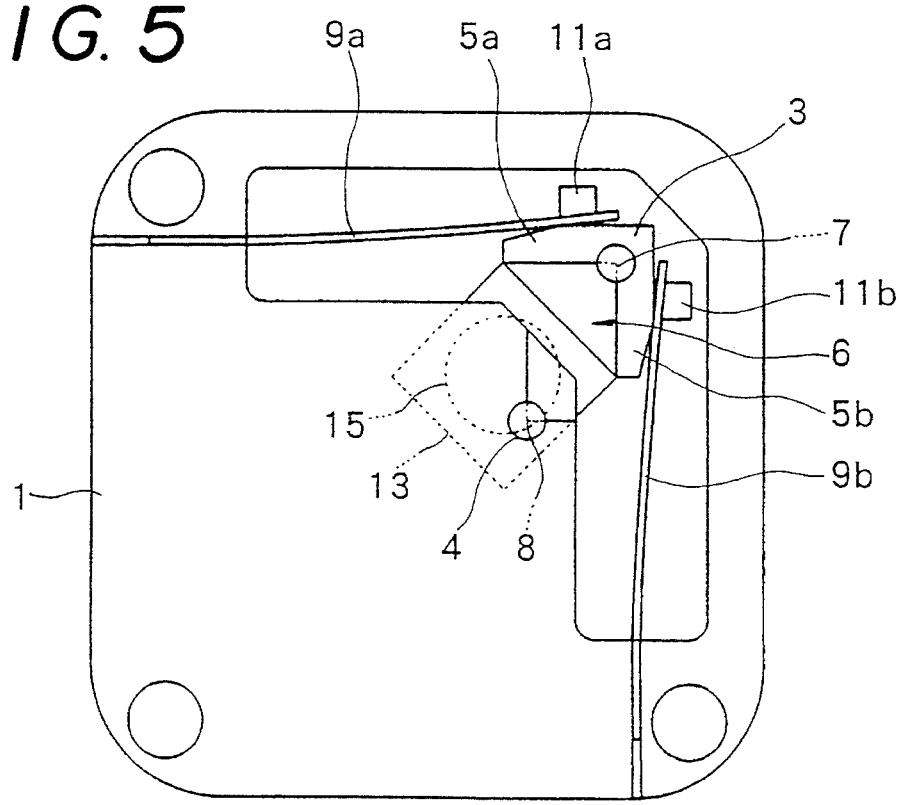
FIG. 5 is a plan view of the IC carrier of FIG. 1, but showing a state in which a movable corner ruler is moved to an IC restriction removed position.

As shown in FIGS. 2, 4 and 5, as well as elsewhere, the movable corner ruler 3 is provided on a bottom surface thereof with an inwardly expanding slide guide element 13. This slide guide element 13 is horizontally moved along a guide surface 14 of the carrier body 1 so that the movable corner ruler 3 is guided between an IC restricted position and an IC restriction removed position. The slide guide element 13 is provided with a tool tip receiving recess 15. For moving the movable corner ruler 3, a tool such as a driver is inserted into the tool tip receiving recess 15.

Figure 6:
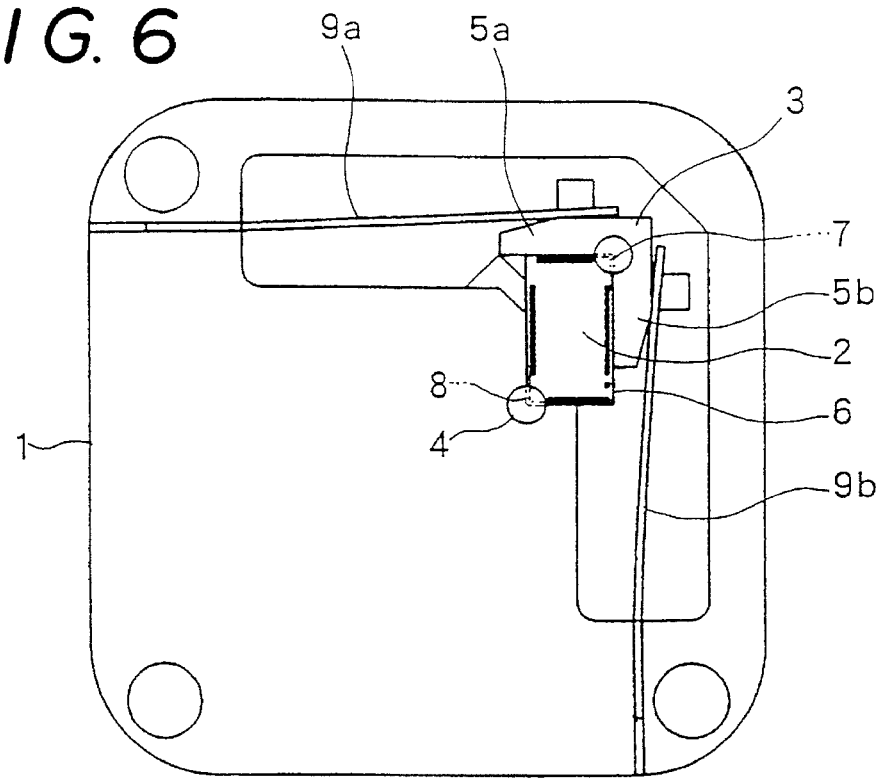
FIG. 6 is a plan view of the IC carrier of FIG. 1, but showing a state in which the movable corner ruler is moved to an IC restricted position.

As shown in FIG. 5, the movable corner ruler 3 is caused to move backwardly to the restriction removed position against the plate springs 9a and 9b. After the IC 2 is received in the IC receiving portion 6, as shown in FIG. 6, the movable corner ruler 3 is caused to proceed forwardly under the effects of the springs 9a and 9b. As the movable corner ruler 3 is moved forwardly, the ruler elements 5a and 5b restrictively push the two sides of the IC 2 which define the first angular portion of the IC 2 to cause the second angular portion of the IC 2 to be pushed against the reference corner ruler 4. At the same time, the locking claws 7 and 8 are caused to engage the upper surfaces of the extreme ends of the first and second angular portions, so that the IC 2 is retained in a correct position of the IC receiving portion 6.

In the embodiment of FIGS. 1 to 6, a comparatively small IC 2 is retained by the IC carrier. In the embodiment of FIG. 7, a comparatively large IC 2 is retained by the IC carrier, but the basic construction thereof is the same as described above.

The movable corner ruler 3 is capable of moving along the two sides of the IC 2, which define the first angular portion of the IC 2, in accordance with the elongated holes 10a and 10b of the plate springs 9a and 9b. Owing to this arrangement, the movable corner ruler 3 can meet with any positional variation of the first angular portion of the IC 2 in a flexible manner.

In the embodiment of FIGS. 8 to 13, the plate springs 9a and 9b of FIGS. 1 to 7 are replaced by coil springs 9a' and 9b'. Since the remaining construction of the embodiment of FIGS. 8 to 13 is the same as that of the embodiment of FIGS. 1 to 7, description thereof is omitted. In this embodiment, the ruler elements 5a and 5b of the movable corner ruler 3 are resiliently supported in a restricting direction by the coil springs 9a' and 9b', respectively. Projections 16 projecting from outer surfaces of the ruler elements 5a and 5b as well as from corresponding inner surfaces of the IC carrier body 1 with respect to the outer surfaces of the ruler elements 5a and 5b, are inserted into respective opposite ends of the coil springs 9a' and 9b', in order to establish resilient retaining positions of the coil springs 9a' and 9b'.

Figure 10:
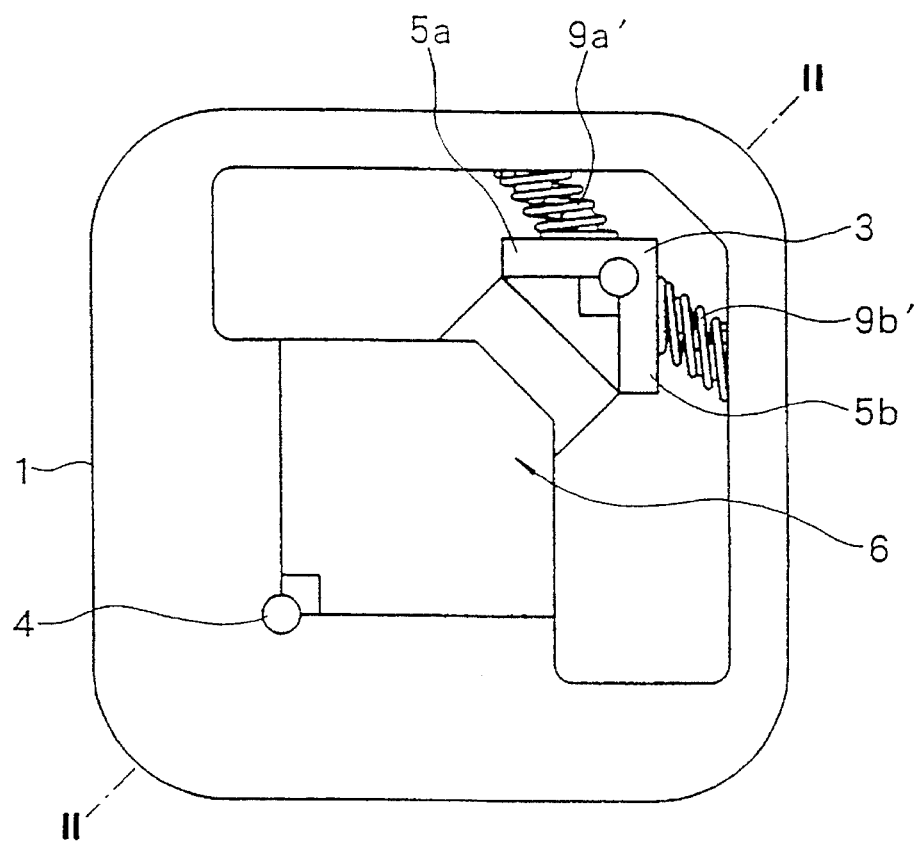
FIG. 10 is a plan view of the IC carrier of FIG. 8, but showing a state in which a movable corner ruler is moved to an IC restriction removed position.
Figure 11:
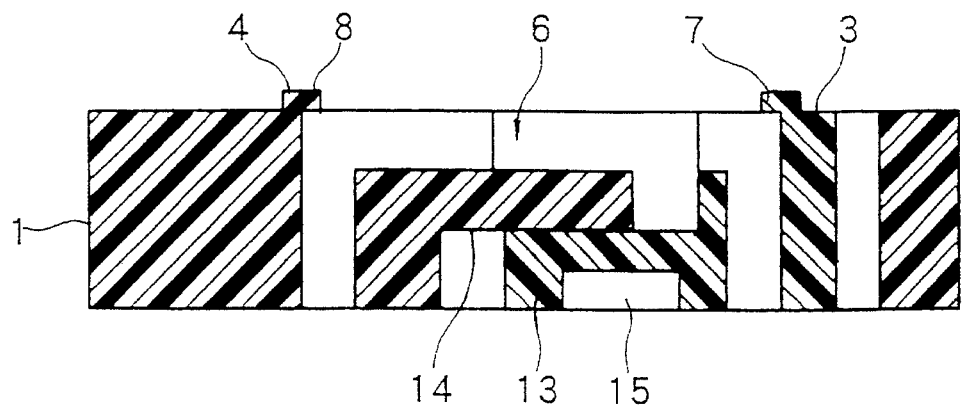
FIG. 11 is a cross-sectional view taken on line 11—11 of FIG. 10.
Figure 12:
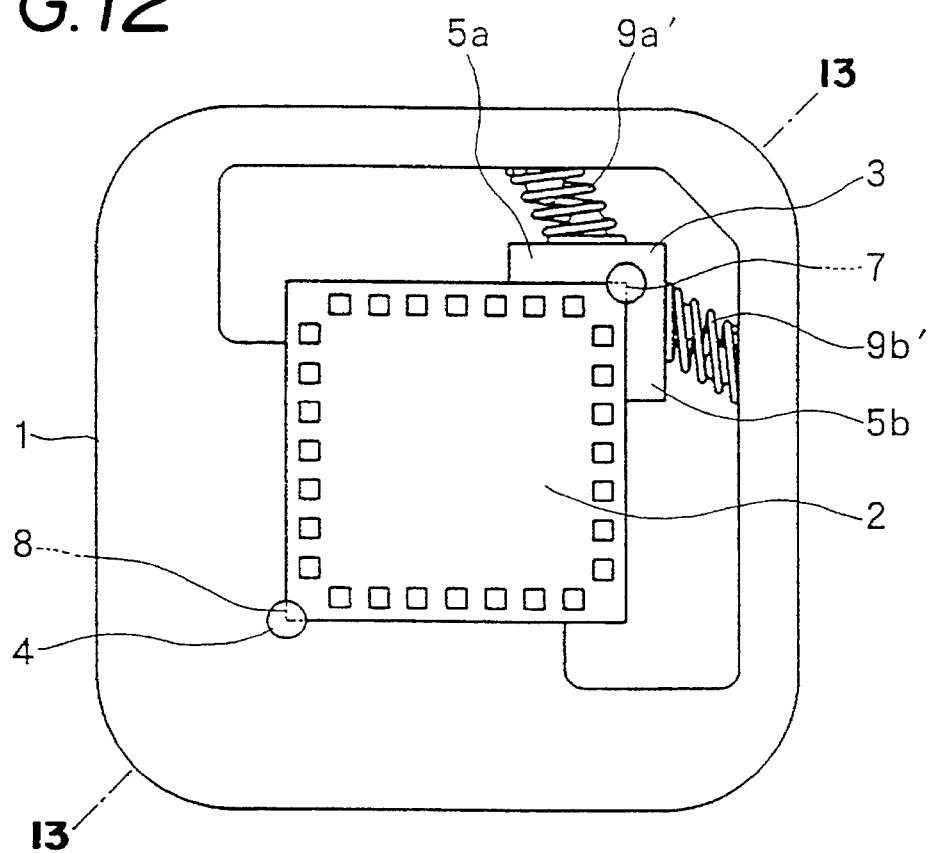
FIG. 12 is a plan view of the IC carrier of FIG. 8, but showing a state in which the IC is restrictively retained.

As shown in FIGS. 10 and 11, the movable corner ruler 3 is moved backwardly to the restriction removed position of the IC 2 against the coil springs 9a' and 9b'. Thereafter, as shown in FIGS. 12 and 13, the movable corner ruler 3 is moved forwardly under the effects of the coil springs 9a' and 9b'. By doing this, the ruler elements 5a and 5b of the movable corner ruler 3 are caused to restrictively push the two sides of the IC 2 which define the first angular portion of the IC 2 and to push the second angular portion of the IC 2 against the reference corner ruler 4 so that the IC 2 is correctly positioned. At the same time, the locking claws 7 and 8 are engaged with the upper surfaces of the first and second angular portions so that the IC 2 is firmly retained in the IC receiving portion 6.

The coil springs 9a' and 9b' cooperatively resiliently bias the movable corner ruler 3 in the restricting direction of the IC 2 and allow the movable corner ruler 3 to move in directions including the directions along the two sides of the IC 2 which define the first angular portion of the IC 2. Owing to this arrangement, the movable corner ruler 3 can flexibly meet with any positional variation of the first angular portion of the IC 2 inserted in the IC receiving portion 6.

FIGS. 14 and 16 show one example in which the above-mentioned reference corner ruler 4 is applied to a rotational structure. The reference corner ruler 4 is vertically rotatably mounted on the carrier body 1 by a shaft 17. The reference corner ruler 4 includes a ruler element 4a and a locking claw 8' extending upwardly from the ruler element 4a generally at right angles. The reference corner ruler 4 is resiliently supported by a spring 18. Owing to this arrangement, as shown in FIG. 14, the locking claw 8' is kept in an upright posture in a lock released position and the ruler element 4a is resiliently supported in its horizontal posture. The ruler element 4a is provided at a distal end thereof with a pressure receiving inclined surface 19.

As shown in FIG. 15, after the movable corner ruler 3 is moved backwardly to cause the IC 2 to be inserted into the IC receiving portion 6, if the movable corner ruler 3 is moved forwardly to push the first angular portion of the IC 2 under the effects of the springs 9a and 9b or 9a' and 9b', the second angular portion of the IC 2 in turn pushes the pressure receiving inclined surface 19 of the reference corner ruler 4 so that the reference corner ruler 4 is rotated downwardly. As a result of this downward rotation of the reference corner ruler 4, as shown in FIG. 16, a restricting surface of the ruler element 4a is correctly in conformity with the two sides of the IC 2 which define the second angular portion of the IC 2, and the locking claw 8' is engaged with the upper surface of the second angular portion of the IC 2. In that positioning location, the reference corner ruler 4 is in abutment with a locking surface 20 of the IC carrier body 1 so that the reference corner ruler 4 is not rotated any further. When the IC 2 is removed by moving the movable corner ruler 3 backwardly, the reference corner ruler 4 is returned to the lock released position by the resilient force of the spring 18.

According to the present invention, by virtue of the construction so far described, two sides of the first angular portion of the IC are resiliently pushed by the pair of ruler elements provided on the movable corner ruler. During the course of this pushing operation, the two sides of the first angular portion of the IC are resiliently restricted by the ruler elements. At the same time, the second angular portion of the IC is caused to be pushed against the reference corner ruler so that the IC can be correctly positioned. Accordingly, even if the IC angular portion is positionally changed due to incorrect IC loading position with respect to the IC carrier, dimensional error of the IC, etc., the IC can be pushed by the movable corner ruler while the IC angular portion is properly restricted by the pair of ruler elements. The IC can be correctly positioned and retained by the IC carrier while the incorrect loading position of the IC is corrected and the IC is pushed against the reference corner ruler.

What is claimed is:

1. An IC carrier comprising:

a movable corner ruler for restricting a first angular portion of an IC, and a reference corner ruler for restricting a second angular portion of the IC, the second angular portion of the IC being in a diagonal relation to the first angular portion of the IC;

said movable corner ruler being resiliently supported by a spring structure such that the first angular portion is resiliently pushed toward said reference corner ruler; and said movable ruler including a pair of ruler elements for pushing those two sides of the IC which define the first angular portion of the IC, with said movable corner ruler being movably resiliently supported by said spring structure for movement along the two sides of the IC.

2. An IC carrier as claimed in claim 1, wherein said movable corner ruler and said reference corner ruler are provided with claws, respectively for engaging upper surfaces of the first and second angular portions of the IC.

3. An IC carrier as claimed in claim 1, wherein said spring structure comprises plate springs resiliently supporting said pair of ruler elements of said movable corner ruler, respectively, and extend along the two sides, respectively, of the IC which define the first angular portion of the IC.

4. An IC carrier as claimed in claim 1, wherein said spring structure comprises coil springs resiliently supporting said pair of ruler elements of said movable corner ruler, respectively.

5. An IC carrier comprising:

a carrier body having an IC receiving portion;

a movable corner ruler movably mounted on said carrier body, said movable corner ruler comprising a first ruler element oriented in a first direction and a second ruler element oriented in a second direction, said first and second ruler elements defining therebetween an inner angular portion;

a reference corner ruler mounted on said carrier body in a reference position, said movable corner ruler and said reference corner ruler being positioned opposite one another across said IC receiving portion; and a spring structure connected between said carrier body and said movable corner ruler for resiliently biasing said movable corner ruler toward said reference corner ruler and allowing said movable corner ruler to move relative to said IC receiving portion in said first and second directions.

6. An IC carrier as claimed in claim 5, wherein said IC receiving portion is adapted to receive an IC; and said movable corner ruler and said reference corner ruler are provided with locking claws, respectively, for retaining the IC in said IC receiving portion by engaging an upper surface of the IC.

7. An IC carrier as claimed in claim 5, wherein said spring structure comprises first and second plate springs resiliently supporting said first and second ruler elements, respectively, and extending substantially in said first and second directions, respectively.

8. An IC carrier as claimed in claim 5, wherein said spring structure comprises first and second coil springs resiliently supporting said first and second ruler elements, respectively.

* * * * *